United States Patent
Braun et al.

(10) Patent No.: US 9,223,221 B2
(45) Date of Patent: Dec. 29, 2015

(54) PHOTORESIST STRIPPING AND CLEANING COMPOSITION, METHOD OF ITS PREPARATION AND ITS USE

(71) Applicant: BASF SE, Ludwigshafen (DE)

(72) Inventors: Simon Braun, Mannheim (DE); Christian Bittner, Bensheim (DE); Andreas Klipp, Lambsheim (DE)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 14/381,039

(22) PCT Filed: Mar. 18, 2013

(86) PCT No.: PCT/IB2013/052141
§ 371 (c)(1),
(2) Date: Aug. 26, 2014

(87) PCT Pub. No.: WO2013/136318
PCT Pub. Date: Sep. 19, 2013

(65) Prior Publication Data
US 2015/0044839 A1 Feb. 12, 2015

Related U.S. Application Data

(60) Provisional application No. 61/611,600, filed on Mar. 16, 2012.

(51) Int. Cl.
| | |
|---|---|
| *H01L 21/461* | (2006.01) |
| *G03F 7/42* | (2006.01) |
| *H01L 21/311* | (2006.01) |
| *C11D 7/50* | (2006.01) |
| *C11D 11/00* | (2006.01) |
| *H01L 21/02* | (2006.01) |
| *H01L 21/027* | (2006.01) |
| *H01L 21/265* | (2006.01) |
| *H01L 21/266* | (2006.01) |
| *H01L 29/16* | (2006.01) |
| *H01L 29/161* | (2006.01) |
| *H01L 29/66* | (2006.01) |

(52) U.S. Cl.
CPC .............. *G03F 7/426* (2013.01); *C11D 7/5004* (2013.01); *C11D 7/5009* (2013.01); *C11D 11/0047* (2013.01); *G03F 7/425* (2013.01); *H01L 21/02057* (2013.01); *H01L 21/0271* (2013.01); *H01L 21/266* (2013.01); *H01L 21/26513* (2013.01); *H01L 21/31133* (2013.01); *H01L 29/16* (2013.01); *H01L 29/161* (2013.01); *H01L 29/66477* (2013.01); *C11D 7/5013* (2013.01); *C11D 7/5022* (2013.01)

(58) Field of Classification Search
USPC ........................................................ 438/725
See application file for complete search history.

(56) References Cited

U.S. PATENT DOCUMENTS

| | | |
|---|---|---|
| 5,554,312 A | 9/1996 | Ward |
| 6,071,868 A | 6/2000 | Kim et al. |
| 6,140,027 A | 10/2000 | Baik et al. |
| 6,958,312 B2 | 10/2005 | Chae et al. |
| 7,250,391 B2 | 7/2007 | Kanno et al. |
| 7,951,764 B2 | 5/2011 | Inaoka |
| 2005/0176259 A1 | 8/2005 | Yokoi et al. |
| 2006/0016785 A1 | 1/2006 | Egbe et al. |
| 2008/0280452 A1 | 11/2008 | Yokoi et al. |
| 2012/0058644 A1 | 3/2012 | Klipp |

FOREIGN PATENT DOCUMENTS

| | | |
|---|---|---|
| EP | 0 647 884 A1 | 4/1995 |
| EP | 2 281 867 A1 | 2/2011 |
| FR | 2 931 669 A1 | 12/2009 |
| WO | 2007/037628 A1 | 4/2007 |
| WO | 2010/127943 A1 | 11/2010 |
| WO | 2011/012559 A2 | 2/2011 |

OTHER PUBLICATIONS

International Search Report issued Aug. 29, 2013 in PCT/IB2013/052141 filed Mar. 18, 2013.
Jinyi Zhong, et al., "Determination of bis(2-hydroethyl) sulfoxide in soil by liquid chromatography-mass spectrometry" Chinese Journal of Analysis Laboratory, vol. 23, No. 8, Aug. 2004, pp. 82-84.
André Leblanc, et al., "New Decontaminants. Oxidative degradation of a mustard gas analog: 2-chloroethyl phenylethyl sulfide by potassium monopersulfate" Phosphorus, Sulfur, and Silicon and the Related Elements, vol. 79, No. 1-4, 1993, pp. 141-145.

*Primary Examiner* — Asok K Sarkar
(74) *Attorney, Agent, or Firm* — Oblon, McClelland, Maier & Neustadt, L.L.P.

(57) ABSTRACT

A photoresist stripping and cleaning composition free from N-alkylpyrrolidones and added quaternary ammonium hydroxides comprising a component (A) which comprises the polar organic solvents N-methylimidazole, dimethylsulfoxide and 1-aminopropane-2-ol.

17 Claims, No Drawings

PHOTORESIST STRIPPING AND CLEANING COMPOSITION, METHOD OF ITS PREPARATION AND ITS USE

The present invention is directed to a novel photoresist stripping and cleaning composition.

Moreover, the present invention is directed to a novel method for preparing the novel photoresist stripping and cleaning composition.

Last but not least, the present invention is directed to the use of the novel implanted photoresist stripping and cleaning composition for the manufacture of electrical devices.

CITED DOCUMENTS

The documents cited in the present application are incorporated by reference in their entirety.

BACKGROUND OF THE INVENTION

When building the transistors during the chip production in the so-called Front End of the Line (FEOL) process, it is necessary to create regions on the semiconductor wafers, in particular silicon wafers, with different doping concentrations of different elements. These different regions are the negative (n) region for which group V elements such as phosphorus and arsenic are used as the doping elements, the positive (p) region for which group III elements such as boron are frequently used, and the intrinsic (i) region with little or no doping. The doping of these regions on the semiconductor wafers are often done by the so-called ion implantation with the required elements. Moreover, other elements, e.g. carbon and fluorine, are nowadays implanted in addition. During the implantation, ions of the desired elements are massively accelerated and shot onto the semiconductor wafer in a vacuum apparatus. Due to their high velocity, they can penetrate into the crystal lattice of the semiconductor wafer and can be incorporated therein by the subsequent annealing step.

In order to allow for the formation of regions with different implantations, regions which are not supposed to be implanted by a certain type of ion have to be "shielded". This shield is formed by a photoresist which was previously structured by a photolithographic process. Photoresist thicknesses can vary broadly in the range of several tens of nm to few µm.

However, the photoresist is not totally immune to the high velocity ion bombardment and a crust formation is observed. Besides the formation of crusts on the tops, a crust layer on the sides of the photoresist structures and at the so called footing is frequently produced. This crust formation is particularly severe when the ion implantation is done on tilted semiconductor wafers for halo ion implantation, i.e. implantation underneath the gate. Such a Crust is very difficult to remove and persists much longer than the large majority of the photoresist, especially when it is formed close to or at the photoresist/semiconductor interface. Moreover, the implantation with additional elements like fluorine yields very difficult to clean crust layers. Furthermore, low implantation energies tend to give harder to clean crusts. Their removal is particularly challenging for ultra-shallow extensions and halo regions, which are currently implemented in integrated circuit (IC) industry.

Additionally, aggressive cleaning chemistries such as SPM (sulfuric peroxide mixture) or hot sulfuric acid are capable of removing the photoresist. However, they frequently cause damage to the fragile and sensitive materials, such as silicon-germanium, germanium and high-k metals materials such as hafnium oxides, lanthanum oxide, aluminium oxide, titanium nitride or tantalum nitride, introduced into the modern transistor designs and can even attack the silicon, which leads to unwanted material loss. All in all, these disadvantageous effects lead to a decrease in performance or even to the malfunctioning of the transistors and, finally, of the whole chip. It can be foreseen that these problems and disadvantages will become even more severe with the 2X, 1X and 0X nodes to come.

Therefore, other cleaning chemistries have been proposed in the prior art.

Thus, the American patent U.S. Pat. No. 5,554,312 discloses a non-aqueous photoresist stripping composition comprising inter alia isopropanol amine (IPAM). However, it does not contain N-methylimidazole (NMI) and dimethyl sulfoxide (DMSO).

The American patent U.S. Pat. No. 6,140,027 as well as WO 2007/037628 A1 and EP 0 647 884 A1 disclose compositions including monoisopropanol amine (MIPA) and DMSO. However, these compositions do not contain N-methylimidazole (NMI).

The American patent U.S. Pat. No. 6,071,868 discloses a photoresist stripping compositions including monoisopropanol amine (MIPA) and DMSO. However, it also contains N-methylpyrrolidione (NMP).

The European patent application EP 0 647 884 A1 discloses an alkaline photoresist stripping composition comprising inter alia DMSO and 1-amino-2-propanol or 1-amino-3-propanol.

The American patent U.S. Pat. No. 6,958,312 B2 discloses a composition for removing a copper-compatible resist inter alia comprising monoisopropanolamine and N,N-dimethylimidazole, which presumably should read N,N-dimethylimidazole-1-amine.

The international patent application WO 2007/037628 A1 discloses a photoresist stripping composition inter alia comprising isopropanol amine (MIPA) and DMSO.

The international patent application WO 2010/127943 A1 discloses a resist stripping composition which is free from N-alkylpyrrolidones and contains NMI, 3-amino-1-propanol, DMSO and 1-aminopropane-2-ol as a cosolvent. The composition must contain 0.05 to <0.5% by weight, based on the complete weight of the composition, of an added quaternary ammonium hydroxide. Moreover, the composition and can contain acetylenic alcohol/alkyleneoxide adducts as surfactants.

The international patent application WO 2011/012559 A2 discloses a substantially water free post ion implant stripping composition containing 1-amino-2-propanol, DMSO and an added quaternary ammonium hydroxide. It may also contain non-ionic alkoxylated alcohols, nonylphenols and nonylethoxylates.

The European patent application EP 2 281 867 A1 discloses a semi-aqueous stripping and cleaning formulation for metal substrates containing isopropanol amine, a quaternary ammonium hydroxide and water.

The American patent U.S. Pat. No. 7,951,764 B2 discloses a Back End of the Line (BEOL) photoresist stripping and cleaning composition comprising DMSO and 1-amino-2-propanol or 1-amino-3-propanol. It may also contain dimethyl hexynol or ethoxylated tetramethyl decyndiol as a sufractant.

However, although some of the photoresist stripping and cleaning compositions avoid the drawbacks of aggressive cleaning chemistries, they do not entirely fulfill all of the strict requirements which are nowadays asked for post-implant photoresist removers in the FEOL process. In particular, the damage to the fragile and sensitive materials mentioned hereinbefore has to be reduced and the removal rates have to be improved further so that the implanted photoresists and the crusts are removed completely from the fine structures on top of the semiconductor wafers in shorter time periods than hitherto possible.

OBJECTS OF THE INVENTION

Therefore, it has been the object underlying the present invention to provide a novel photoresist stripping and cleaning composition which is particularly useful for removing post-implant photoresists in particular in the FEOL process during the production of ICs.

The novel photoresist stripping and cleaning composition should have a flashpoint higher than 80° C. and should cause less safety, health and environmental risks for the user. Moreover, it should exhibit improved removal and cleaning rates so that the implanted photoresists and the crusts can removed completely from the fine structures on top of the semiconductor wafers in shorter time periods than hitherto possible without damaging the fragile and sensitive materials, such as silicon-germanium, germanium and high-k materials such as hafnium oxides, lanthanum oxide, aluminium oxide, titanium nitride or tantalum nitride, introduced into the modern transistor designs. In particular, the substitution of toxic compounds like NMP by less toxic compounds or substituting or entirely omitting corrosive quaternary ammonium hydroxides without jeopardizing the stripping and cleaning power of the respective photoresist stripping and cleaning compositions are desired.

Moreover, it has been another object of the invention to provide a novel method for preparing the novel photoresist stripping and cleaning composition, which can be carried out easily and safely.

Additionally, it has been another object of the invention to provide a novel method of effectively and quantitatively removing photoresists, in particular post-implant photoresists and the crusts created by the ion implantation, from the semiconductor wafers in short time periods without doing damage to the fragile and sensitive materials, such as silicon-germanium, germanium and high-k materials such as hafnium oxides, lanthanum oxide, aluminium oxide, titanium nitride or tantalum nitride, introduced into the modern transistor designs.

Furthermore, the novel photoresist stripping and cleaning composition and the novel method for removing photoresists should not only be exceptionally useful in the manufacture of ICs, but also in the manufacture of other devices having features and structures in nm and µm dimensions and/or sensitive materials, such as the materials described in the above paragraphs used as gate oxides.

SUMMARY OF THE INVENTION

Accordingly, the novel composition has been found, the novel composition being free from N-alkylpyrrolidones and added quaternary ammonium hydroxides and comprising a component (A) which comprises the polar organic solvents N-methylimidazole, dimethylsulfoxide and 1-aminopropane-2-ol.

Hereinafter the novel composition is referred to as the "composition of the invention".

In one embodiment the composition of the invention contains at least one additive (B) selected from the group consisting of: (B-I) quaternary ammonium salts, (B-II) sulfoxides and thioethers, (B-III) surfactants and (B-IV) other additives.

In a further embodiment the composition of the invention is characterized in that it contains an additional additive (C) which is selected from the group consisting of surfactants other than the additives (B-III) and alkanolamines other than 1-aminopropane-2-ol (A) and optionally an oxidizing agent (D).

In one embodiment the composition of the invention is a photoresist stripping and cleaning composition.

Moreover, the novel method for preparing the composition of the invention has been found, the said method comprising the steps of
(1) mixing
  the three organic polar solvents (A) or
  the three organic polar solvents (A) and at least one additive selected from the additives (B), (C) and (D);
  in the absence of N-methylpyrrolidone and quaternary ammonium hydroxides; and
(2) homogenizing the resulting mixture.

Hereinafter, the novel method for preparing the composition of the invention is referred to as the "preparation method of the invention".

Moreover, the novel method for removing bulk photoresists, patterned photoresists, contaminants and crusts and/or residues resulting from etching, ashing and/or ion implantation processes from substrates has been found, the said method comprising the steps of
(i) contacting the substrate at least once with the composition of the invention; and
(ii) removing the substrate from the contact with the composition of the invention after the process step (i).

Hereinafter, the novel method for removing bulk photoresists, patterned photoresists, contaminants and crusts and/or residues resulting from etching, ashing and/or ion implantation processes from substrates is referred to as the "removal method of the invention".

Last but not least, the novel method for manufacturing an electrical device has been found, the method comprising the steps of
(a) providing a substrate;
(b) forming the photoresist pattern covering the areas of the substrate which are not to be exposed to an ion implantation treatment;
(c) exposing the substrate with the photoresist pattern to an ion implantation treatment thereby forming doped regions in the areas not covered by the photoresist pattern;
(d) removing the photoresists and the crusts and/or residues formed by the ion implantation treatment by the removal method of the invention thereby obtaining a substrate having regions with a particular doping;

Hereinafter, the novel method for manufacturing electrical devices is referred to as the "manufacturing method of the invention".

Advantages of the Invention

In view of the prior art discussed above, it was surprising and could not be expected by the skilled artisan that the objects underlying the invention could be solved by the composition, the preparation method, the removal method and the manufacturing method of the invention.

Thus, the composition of the invention was most particularly useful not only for removing post-implant photoresists in particular in the FEOL process during the production of ICs, but also for removing bulk photoresists, patterned photoresists contaminants and crusts and/or residues resulting from etching, ashing and/or ion implantation processes from substrates.

The composition of the invention had a flashpoint higher than 80° C. and caused less safety, health and environmental risks for the user. Moreover, it exhibited improved removal and cleaning rates so that the bulk photoresists, patterned photoresists, contaminants and crusts and/or residues resulting from etching, ashing and/or ion implantation processes could be removed completely from the substrates in particular on top of semiconductor wafers, by the removal method of the invention in shorter time periods than hitherto possible without damaging the fragile and sensitive materials, such as silicon-germanium, germanium and high-k materials such as hafnium oxides, lanthanum oxide, aluminum oxide, titanium nitride or tantalum nitride, introduced into the modern transistor designs.

Due to the advantageous property profile of the composition of the invention, it could be prepared safely and easily with the help of the production method of the invention.

Likewise, the removal method of the invention could be carried out easily and safely.

Furthermore, the manufacturing method of the invention exhibited an exceptional reproducibility and yielded highly reliable electrical devices having an exceptionally long service life.

Additionally, the composition, the production method, and the removal method of the invention were not only be exceptionally useful in the manufacture of ICs, but also in the manufacture of other devices having features and structures in nm and μm dimensions and/or sensitive materials, such as the materials described in the above paragraphs used as gate oxides.

In particular, the composition, the production method, and the removal method of the invention could be employed advantageously for manufacturing logic and memory devices, like CPUs, GPUs and RAMs, both in planar and vertical configuration, e.g. FinFET and Tri-Gate configuration; liquid crystal panels; organic electroluminescent panels; printed circuit boards; micromachines; DNA chips; microplants and magnetic heads; optical devices, in particular, optical glasses such as photo-masks, lenses and prisms; inorganic electro-conductive films such as indium tin oxide (ITO); optical integrated circuits; optical switching elements; optical waveguides; optical monocrystals such as the end faces of optical fibers and scintillators; solid laser monocrystals; sapphire substrates for blue laser LEDs; semiconductor monocrystals; and glass substrates for magnetic disks.

DETAILED DESCRIPTION OF THE INVENTION

In its broadest aspect, the present invention is directed to the composition of the invention.

The composition of the invention is free from N-alkylpyrrolidones, in particular N-methylpyrrolidone and N-ethylpyrroline, and added quaternary ammonium hydroxides.

In the case of the N-alkylpyrrolidones, the characteristic "free from" means that the compounds cannot be detected in the composition of the invention with the known state-of-the-art analytical methods like gas chromatography, mass spectrometry or combinations thereof.

In the case of the quaternary ammonium hydroxides, the characteristic "free from added" means that no quaternary ammonium hydroxides are purposefully added to the composition of the invention. When quaternary ammonium salts b6 hereinafter described are contained in the composition of the invention the quaternary ammonium ions might be present with hydroxide ions formed in situ from basic compounds in the presence of water in equilibrium reactions. However, such equilibrium mixtures are not to be understood as "added quaternary ammonium hydroxides" and the calculated sum of hydroxide ions and quaternary ammonium ions should not exceed 0.05% by weight, based on the complete weight of the composition of the invention.

The composition of the invention is liquid at least at room temperature (i.e. 23° C. and 1013 mbar), preferably at least at 10° C., more preferably at least at 0° C. and most preferably at least at −10° C.

The composition of the invention can be a dispersion, i.e. an emulsion or suspension, or a homogeneous composition, wherein all the ingredients are molecularly dispersed. Preferably, the composition of the invention is a homogeneous, molecularly dispersed composition.

In one embodiment the composition of the invention contains water.

In a further embodiment the composition of the invention is free from water.

"Free from water" means that the composition of the invention contains based on its complete weight, less than 1% by weight, preferably less than 0.1% by weight, more preferably less than 0.01% by weight and most preferably less than 0.001% by weight of water.

In the case that the composition of the invention contains the quaternary ammonium salts b6 hereinafter described, it is preferably free from water in order to avoid the formation of higher amounts of hydroxide ions.

The composition of the invention three polar organic solvents (A): N-methylimidazole, dimethyl sulfoxide and 1-aminopropane-2-ol having the CAS number 78-96-6. 1-Aminopropane-2-ol is frequently incorrectly referred to as isopropanolamine or 1-amino-2-propanol. It is customarily referred to with the abbreviations MIPA or IPAM.

The three organic solvents A, are preferably present in amounts of 10-80% by weight N-methylimidazole,
10-45% by weight dimethyl sulfoxide and
10-45% by weight 1-aminopropane-2-ol, the weight percentages being based on the complete weight of the organic solvents A.

The composition of the invention contains N-methylimidazole, dimethyl sulfoxide and 1-aminopropane-2-ol A in a weight ratio of preferably, 0.5:(0.6-1.4):1-4:(0.6-1.4):1,
more preferably, 0.8:(0.7-1.3):1-3.5:(0.7-1.3):1 and
most preferably, 1:(0.8-1.2):1-3:(0.8-1.2):1.

In a first embodiment of the composition of the invention, it consists or consists essentially of the three organic polar solvents A. "Consisting essentially of" means that the composition of the invention contains besides the three organic polar solvents A only trace amounts of other components contained as unavoidable impurities in the three organic polar solvents A or which may be generated by prolonged storage and use of the composition of the invention.

In a second embodiment of the composition of the invention, it contains the three organic polar solvents A and additionally contains at least one of the additives B, C or D hereinafter described.

The amount of the three organic polar solvents A in the second embodiment of the composition of the invention can vary broadly and depends on the nature of the additives B, C or D hereinafter described. Therefore, the amount of the three organic polar solvents A can be adjusted most advantageously to the requirements of the various compositions, the production method, the removal method and the manufacturing method of the invention. Preferably, the second embodiment of the composition of the invention contains the three organic polar solvents A in an amount of 50-99.99% by weight, preferably 60-99.9% by weight, most preferably 70-99% the weight percentages being based on the complete weight of the second embodiment of the composition of the invention.

In a third embodiment of the composition of the invention, it contains two of the organic polar solvents A and at least one additive B hereinafter described.

The third embodiment of the composition of the invention may optionally contain at least one of the additives C and D.

Preferably, the third embodiment of the composition of the invention contains

N-methylimidazole and dimethyl sulfoxide;
N-methylimidazole and 1-aminopropane-2-ol or
dimethyl sulfoxide and 1-aminopropane-2-ol in a weight ratio of 0.1:1-10:1, preferably 0.5:1-5:1, more preferably 0.8:1-4:1 and most preferably 1:1-3:1.

The amount of the two organic polar solvents A in the third embodiment of the composition of the invention can vary broadly and depends on the nature of the additive B and, optionally, on the nature of the additives C and D hereinafter described. Preferably, the third embodiment of the composition of the invention contains the two organic polar solvents A in an amount of a 50-99.99% by weight, preferably 60-99.9% by weight, most preferably 70-99% by weight, the weight percentages being based on the complete weight of the second embodiment of the composition of the invention.

The additive B is selected from the group consisting of the additives (B-I) quaternary ammonium salts, (B-II) sulfoxides and thioethers, (B-III) surfactants and (B-IV) other additives.

The additive (B-I) quaternary ammonium salts is selected from the group consisting of (b6) quaternary ammonium salts described hereinafter.

The other additives (B-IV) are selected from the group consisting of: (b1) 2-hydroxypropionic acid amides of the general formula I, (b2) aliphatic esters of the general formula II, b3) acetic, propionic, butyric, pentanoic acid and hexanoic acid amides of the general formula III and (b7) ethyleneoxide adducts of diols of the general formula V as described hereinafter.

The additive (B-II) sulfoxides and thioethers is selected from the group consisting of (b4) sulfoxides and thioethers of the general formula IV described hereinafter.

The additive (B-III) surfactants is selected from the group consisting of: (b5) alkyleneoxide adducts of acetylenic alcohols, (b8) adducts of alkylphenols, (b9) adducts of alcohols with alkyleneoxides and (b10) tristyrylphenol ethers selected from the group consisting of (b-10-) tristyrylphenol-poly (alkyleneglycol) ethers of at least one glycol and (b-10-2) adducts of tristyrylphenol and at least one alkyleneoxide described hereinafter.

The additive b1 is selected from the group consisting of 2-hydroxypropionic acid amides of the general formula I:

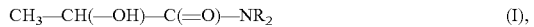

CH₃—CH(—OH)—C(=O)—NR₂ (I), wherein the variable R represents alkyl groups having 1-6, preferably 1-4, more preferably 1 or 2 and most preferably 1 carbon atoms or atom. Therefore, N,N-dimethyl-lactamide is most preferably used as the additive b1.

The additive b2 is selected from the group consisting of aliphatic esters of the general formula II:

R¹—C(=O)—O—R² (II), wherein, independently of each other, the variable R¹ represents alkyl groups having 1-4, preferably 1 or 2 and most preferably 1 carbon atoms or atom and the variable R² represents linear and branched alkyl groups having 4-8, preferably 4-6 and most preferably 5 carbon atoms or atom. Most preferably, isoamyl is preferably used as R². therefore, isoamyl acetate is most preferably used as the additive b2.

The additive b3 is selected from the group consisting of acetic, propionic, butyric, pentanoic acid and hexanoic acid amides of the general formula III:

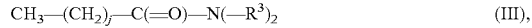

CH₃—(CH₂)ⱼ—C(=O)—N(—R³)₂ (III), wherein the index j represents 0 or an integer from 1-4, most preferably 0, and the variable R³ represents alkyl groups having 2-6, preferably 2-4, most preferably 1 carbon atoms at least one, preferably one, hydroxyl group. Therefore, N,N-dimethyl acetic acid amide is most preferably used as additive b3.

The additive b4 is selected from the group consisting of sulfoxides and thioethers of the general formula IV:

R⁴—S(=O)ₓ—R⁵ (IV), wherein the index x is 0 or 1 and the variables R⁴ and R⁵ can be the same or different from each other and contain at least 2 carbon atoms. Preferably, R⁴ and R⁵ represent independently of each other linear and branched alkyl groups and alkylether groups having at least one hydroxyl group and at least two carbon atoms; and arylalkyl groups wherein the alkyl moiety is having 2-6 carbon atoms and is directly bonded to the sulfur atom. More preferably, at least one of R⁴ and R⁵ is a linear and branched alkyl group or an alkylether group having at least one hydroxyl group and at least two carbon atoms.

Examples of suitable sulfoxides b4 are bis(2-hydroxyethyl) sulfoxide, hydroxyethyl-phenylethyl sulfoxide, 2-hydroxyethyl-(1',2'-dihydroxypropoxy-6-hydroxypropyl) sulfoxide, 2-hydroxyethyl-(2'-hydroxypropyl) sulfoxide and 2-hydroxyethyl-(1',2'-dihydroxypropyl) sulfoxide.

Examples of a suitable thioether b4 is 4,10-dioxa-7-thia-tridecane-2,12-diol.

The additive b5 is selected from the group consisting of alkyleneoxide adducts, preferably ethyleneoxide, propyleneoxide and ethyleneoxide-propyleneoxide adducts, of acetylenic alcohols. Preferably, the alkyleneoxide adducts of acetylenic alcohols described in the American patent application US 2008/0280452 A1, page 4, paragraph [0054] to page 5, paragraph [0061] are used as the additives b5.

The additive b6 is selected from the group consisting of quaternary ammonium salts containing at least one quaternary nitrogen atom. The quaternary ammonium salts are salts of acids selected from the group consisting of hydrochloric acid, hydrobromic acid, acidic phosphonic acid esters, acidic phosphoric acid esters and acidic sulfuric acid esters, preferably acidic sulfuric acid esters, most preferably sulfuric acid methyl ether or methyl sulfate. Therefore, the counter-ion most preferably used in the additives b6 is methyl sulfate which is also referred to as metosulfate.

In the case that the additive b6 contains one quaternary nitrogen atom, at least one of the residues of the quaternary ammonium nitrogen preferably contains at least one functional group selected from hydroxyl groups and amido groups.

In case that the additive b6 contains at least two, preferably at least three, and most preferably three quaternary nitrogen atoms, the residues on the quaternary nitrogen atoms may or may not contain the said functional groups.

The quaternary nitrogen atom or atoms can be part of a heterocyclic, preferably an aliphatic heterocyclic, ring. The heterocyclic ring may also contain at least one additional heteroatom selected from oxygen and sulfur.

Examples of suitable additives b6 containing one quaternary nitrogen atom are choline metosulfate, tris(2-hydroxyethyl)-methyl ammonium metosulfate, N-(2-hydroxyethyl)-

N-methyl-tetrahydro 1,4-oxazinium metosulfate, N,N-di-(2-hydroxyethyl)-N-methyl-acetamidopropyl ammonium metosulfate, the metosulfate of the reaction product of diethylenetriamine with dimethyl sulfate in a molar ratio of 1:8, the metosulfates of alkyleneoxide, preferably ethyleneoxide, propyleneoxide and ethyleneoxide-propyleneoxide adducts of polyamines, in particular 1,6-diaminohexane and diethylenetriamine quarternized with dimethylsulfate.

The additive b7 is selected from the group consisting of ethyleneoxide adducts of diols of the general formula V:

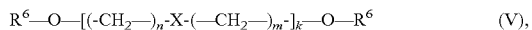

wherein the indices n and m represent independently of each other an integer from 2-4, and most preferably 3, the index k represents an integer from 1-3, most preferably, the variable X represents an oxygen or a sulfur atom, most preferably an oxygen atom, and the variable $R^6$ represents a residue of the general formula VI:

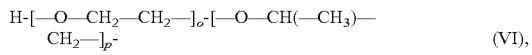

wherein the index o is an integer of from 2-12, preferably 4-6, and p is 0 or an integer of 1-6.

The additive b8 is selected from the group consisting of alkylphenols wherein the alkyl residue has 6-16 carbon atoms with at least one alkyleneoxide selected from the group consisting of ethyleneoxide, propyleneoxide, butyleneoxide and styrene oxide. Preferably, styrene oxide and ethyleneoxide and/or propyleneoxide are used in a molar ratio of (5-10):(10-20) and more preferably (5-9):(11-17).

The additive b9 is selected from the group consisting of adducts of alcohols selected from the group consisting of saturated and unsaturated, preferably saturated, linear and branched, preferably branched, aliphatic alcohols having 6-20, preferably 6-19 and most preferably 8-18 carbon atoms, with alkyleneoxides Preferred branched, saturated aliphatic alcohols are selected from the group consisting of
  saturated, branched aliphatic alcohols having 16 or 17 carbon atoms and a degree of branching of 0.5-5, preferably 2.4-4.5; and
  saturated, branched aliphatic alcohols having 8 to 15 carbon atoms and a degree of branching of 0.1-4.5, preferably 1-3.

For determining the degree of branching, the number y of methyl groups in the alkyl groups is determined by NMR measurements. The degree of branching is then calculated as y−1. Thus, for example, a linear alkyl group has only one methyl group; therefore, the degree of branching is 0. Contrary to this, an isopropyl group, for example, has two methyl groups; therefore, the degree of branching is one.

Preferred linear, saturated aliphatic alcohols are selected from the group consisting of alcohols having 6-18, more preferably 8-18 and most preferably 14-18 carbon atoms.

The alkyleneoxides are selected from the group consisting of ethyleneoxide, propyleneoxide, butyleneoxide and styrene oxide, preferably ethyleneoxide, propyleneoxide and styrene oxide.

Preferably, at least two alkyleneoxides are used.
Preferred combinations of at least two alkyleneoxides are
  ethyleneoxide and propyleneoxide, most preferably in a molar ratio of (5-10):(10-20); and
  styrene oxide and ethyleneoxide, most preferably in a molar ratio of (5-9):(11-17);
  styrene oxide and propyleneoxide, most preferably in a molar ratio of (5-9):(11-17); and
  styrene oxide, ethyleneoxide and propyleneoxide, most preferably in a molar ratio of styrene oxide/ethyleneoxide plus propyleneoxide (5-9):(11-17).

The additive b10 is selected from the group consisting of tristyrylphenol ethers selected from the group consisting of
  tristyrylphenol-poly(alkyleneglycol) ethers of at least one glycol selected from the group consisting of ethane-1,2-diol, 1-phenylethane-1,2-diol, propane-1,2- and -1,3-diol, butane-1,2-, -1,3- and -1,4-diol and 2-methylpropane-1,2- and -1,3-diol and
  adducts of tristyrylphenol and at least one alkyleneoxide selected from the group consisting of ethyleneoxide, propyleneoxide, butyleneoxide and styrene oxide;

When more than one type of glycol or alkyleneoxide are used, the respective molar ratios can vary broadly and, therefore, can be most advantageously adjusted to the particular requirements of the composition, the preparation method, the removal method and the manufacturing method of the invention.

The additives b1, b8, b9 and b10 are preferably used.
The composition of the invention can contain at least one additional additive C selected from the group consisting of surfactants other than the additives B and alkanolamines other than 1-aminopropane-2-ol A.

Preferably, the surfactant C is selected from the group consisting of alkylbenzenesulfonic acids wherein the alkyl group contains 6-16, preferably 8-12, carbon atoms and the alkanolamine C is selected from the group consisting of ethanolamine, diethanolamine and triethanolamine, most preferably triethanolamine.

In one alternative the composition of the invention contains at least one oxidizing agent D preferably, the oxidizing agent is selected from the group consisting of organic and inorganic peroxides, ozone. Most preferably, hydrogen peroxide is used.

In an other alternative the composition of the invention is free from oxidizing agents, preferably, the oxidizing agent is selected from the group consisting of organic and inorganic peroxides, ozone; most preferably, hydrogen peroxide or ozone.

The term "free from" is defined above and here used analogous for oxidizing agents.

In one embodiment the composition of the invention contains one additive selected from the group consisting of (B-I) quaternary ammonium salts, (B-II) sulfoxides and thioethers, (B-III) surfactants and (B-IV) other additives or selected from the group consisting of (b1), (b2), (b3), (b4), (b5), (b6), (b7), (b8), (b9) and (b10) or (C) or (D).

In an other embodiment the composition of the invention contains 2, 3, 4, 5, 6, 7, 8, 9, 10 or even more different additives, preferably 2, 3, 4, more preferably 2, 3, especially 2, of the same type (B-I), (B-II), (B-III), (B-IV) or (b1), (b2), (b3), (b4), (b5), (b6), (b7), (b8), (b9) and (b10) or (C) or (D). For example the composition of the invention comprise 2 or more different quaternary ammonium salts, 2 or more different sulfoxides and/or thioethers, 2 or more surfactants or other additives.

In a further embodiment the composition of the invention contains any combination of 2, 3, 4, 5, 6, 7, 8, 9, 10 or even more different additives, preferably 2, 3, 4, more preferably 2, 3, especially 2, of (B-I), (B-II), (B-III), (B-IV), and (D) or any combination of 2, 3, 4, 5, 6, 7, 8, 9, 10 or even more different additives, preferably 2, 3, 4, more preferably 2, 3, especially 2, of (b1), (b2), (b3), (b4), (b5), (b6), (b7), (b8), (b9), (b10), (C) and (D), preferably (B-III) and (C).

In an additional embodiment, in case that the composition of the invention contains two of the organic polar solvents A and at least one additive B herein described, preferably in the case it contains dimethyl sulfoxide and 1-aminopropane-2-ol it is free from silicon surfactants and/or glycol ether.

The term "free from" is defined above and here used analogous.

The composition of the invention is preferably prepared by the preparing method of the invention comprising the steps of
(1) mixing
 the three organic polar solvents A;
 the three organic polar solvents A and at least one additive selected from the additives B, C and D;
 two of the organic polar solvents A and at least one additive B; or
 two of the organic polar solvents A, at least one additive B and/or at least one of the additives C and/or D
 in the absence of N-methylpyrrolidone and quaternary ammonium hydroxides; and
(2) homogenizing the resulting mixture.

Customary and standard mixing processes and mixing apparatuses such as agitated vessels, in-line dissolvers, high shear impellers, ultrasonic mixers, homogenizer nozzles or counterflow mixers can be used for carrying out the production method of the invention.

The composition of the invention is particularly useful for the removal method of the invention.

In the removal method of the invention, bulk photoresists, patterned photoresists, contaminants and crusts and/or residues of patterned photoresists resulting from etching, ashing and/or ion implantation processes are removed from substrates having features with nm and μm dimensions in particular dimensions as used in devices having nodes <45 nm.

The removal method of the invention comprises the steps of
(i) contacting the substrate at least once with the composition of the invention, in particular the composition of the invention prepared in accordance with the preparation method of the invention; and
(ii) removing the substrate from the contact with the composition of the invention.

After the process step (ii), at least one rinsing step (iii) is carried out. Preferably, rinsing solutions comprising deionized water and alkanolamines, in particular 1-aminopropane-2-ol, are used.

After the rinsing step (iii), the substrate is dried using customary and known drying methods such as blade drying and Marangoni drying before the substrate is processed further.

The removal process of the invention can be applied to
 substrates useful for fabricating electrical devices, in particular, semiconductor integrated circuits (ICs) and transistors, more preferably substrates useful for fabricating ICs with LSI (large-scale integration) or VLSI (very-large-scale integration) in the Back End of the Line (BEOL) process and transistors for chips in the Front End of the Line (FEOL) process, especially transistors for logic and memory devices, like CPUs, GPUs and RAMs, both in planar and vertical configuration, e.g. FinFET and Tri-Gate configuration; substrates for fabricating liquid crystal panels, organic electroluminescent panels and printed circuit boards;
 substrates useful for fabricating micromachines; DNA chips; microplants and magnetic heads; as well as
 substrates useful for fabricating optical devices, in particular, optical glasses such as photo-masks, lenses and prisms, inorganic electro-conductive films such as indium tin oxide (ITO), optical integrated circuits, optical switching elements, optical waveguides, optical monocrystals such as the end faces of optical fibers and scintillators, solid laser monocrystals; sapphire substrates for blue laser LEDs, semiconductor monocrystals and glass substrates for magnetic disks.

Preferably, the removal process of the invention is applied to substrates for fabricating electrical devices, in particular substrates for fabricating microchips. Most preferably, the substrates are semiconductor wafers, in particular silicon wafers.

Preferably, the removal process of the invention is applied to semiconductor wafers in the FEOL process for building the transistors during the chip production and in the BEOL process for the building of the three-dimensional architecture which connects the transistors on a microchip with "macro-world", i.e. the electrical connections with dimensions in the micrometer and millimeter range.

Most preferably, the removal process of the invention is applied to semiconductor wafers in the FEOL process. The semiconductor wafers can be virgin wafers or have features with nm and/or μm dimensions. Most preferably, the features with nm dimensions and node sizes in the 3X, 2X, 1X and 0X dimension are transistors or precursors of transistors on the surface of the semiconductor wafer. Even more preferably the transistors are in a vertical integration schema or configuration, like e.g. in FinFET and Tri-Gates.

Moreover, the features with nm dimensions can have high aspect ratios, i.e. ratios >2 and even up to 75.

As is known in the art, the transistor structures comprise, the gate, the source, the drain, a gate oxide layer and a channel layer.

In the modern designs, the gate oxide layer contains or consists of high-k materials, i.e. materials having a higher dielectric constant than silicon dioxide, in particular, hafnium oxides, lanthanum oxide, aluminium oxide, titanium nitride and tantalum nitride, and the channel layer contains or consists of silicon-germanium, in particular $Si_{0.2}Ge_{0.8}$ to $Si_{0.7}Ge_{0.2}$, or germanium.

The photoresists can be positive-tone or negative-tone photoresists.

Suitable resist are described in, for example, the American patent U.S. Pat. No. 7,250,391 B2, column 1, lines 55 to 60 or in the American patent applications US 2005/0176259 A1, page 2, paragraphs [0029] and [0030], US 2006/0016785 A1, page 3, paragraphs [0025] to [0027] or US 2008/0280452 A1, paragraphs [0027] to [0029] and page 5, paragraph [0062].

The patterned photoresists patterns can be prepared by photolithographic methods customary and known in the art of manufacturing microchips.

To this end, bulk photoresists layers are exposed to electromagnetic radiation or corpuscular radiation.

The patterns on the photoresist can be formed by means of masks or direct scribing by bending, preferably of electromagnetic radiation.

Preferably, UV-rays, deep UV-rays, extreme UV-rays, excimer laser rays, in particular, KrF-, ArF- or $F_2$-excimer laser rays, or X-rays are used as the electromagnetic radiation. For the exposure, the resist layer may be exposed to a light source capable of emitting such active rays, as for example, low-pressure mercury lamps, high-pressure mercury lamps, ultra-high-pressure mercury lamps or xenon lamps.

Preferably, electron beams are used as corpuscular radiation.

Thereafter, the still soluble unexposed regions of the negative-tone photoresists or the solubilized exposed regions of the positive-tone photoresists are removed.

If desired, a post-exposure baking step can be carried out before developing the exposed photoresists.

The formed the photoresists patterns might also be altered or multiplied by deposition of additional, preferably organic, layers that might perform a self-alignment at the previously formed photoresist patterns. This is often referred to as direct-self assembly (DSA) in the art.

The crusts and/or residues are then obtained by etching, ashing and/or ion implantation processes customary and known in the art of manufacturing microchips.

Preferably, the removal process of the invention is applied to photoresist patterns and crusts and/or residues resulting from the exposure of the photoresist patterns to the ion implantation processes carried out in the FEOL process for building the transistors on the semiconductor wafers.

Most preferably, the composition and the removal process of the invention are used in the manufacturing process of the invention.

The manufacturing process of the invention comprises the steps of
(a) providing a substrate, which can be virgin silicon wafers or wafers which contain areas or layers of silicon-germanium or germanium and/or features with nm and μm dimensions and preferably high aspect ratios as described hereinbefore;
(b) forming the photoresist pattern as described hereinbefore covering the area on the wafer which are not to be exposed to an ion implantation treatment;
(c) exposing the substrate with the photoresist pattern to an ion implantation treatment thereby forming doped regions in the areas not covered by the photoresist pattern; and
(d) removing the photoresists and the crusts and/or residues formed by the ion implantation treatment by the removal method of the invention thereby obtaining a substrate having regions with a particular doping, as for example, an n-type doping.

The process steps (a) to (d) of the manufacturing process of the invention are preferably repeated several times, more preferably at least once, to create different regions on the wafer having different charge densities and profiles and, most preferably, to create also n- and p-type regions on the surface simultaneously. The different types of regions are required to form NMOS and PMOS regions on the wafer that are combined to CMOS devices.

In one embodiment the composition of the invention is used on, preferably in the removal process of the invention or in the manufacturing process of the invention, wafers with an silicon-germanium, in particular $Si_{0.2}Ge_{0.8}$ to $Si_{0.7}Ge_{0.2}$, or germanium layer, preferably channel layer.

The manufacturing method of the invention is excellently reproducible and has—if at all—a very low reject rate. It yields transistors with excellent electrical properties and a long service life.

EXAMPLES

Examples 1-18

The Preparation of the Photoresist Stripping and Cleaning Compositions 1-18 of the Examples 1-18 and their Stripping and Cleaning Properties The photoresist stripping and cleaning compositions 1-18 of the Examples 1-18 were prepared by mixing the desired components (solvents A, additives B and C) in the desired amounts in mixing vessels and homogenizing the resulting mixtures. The respective compositions are compiled in the Tables 1 and 2.

TABLE 1

Composition of the Photoresist Stripping and Cleaning Compositions 1-11 of the Examples 1-11

| Example No. | Solvent A/% by weight | | | Additive B/% by weight | | | | | | | | |
|---|---|---|---|---|---|---|---|---|---|---|---|---|
| | NMI[a] | MIPA[b] | DMSO[c] | b1[d] | b5-1[e] | b4[f] | b10-1[g] | b10-2[h] | b5-2[i] | b7[j] | b6-1[k] | b9[l] |
| 1 | 50 | 25 | 25 | — | — | — | — | — | — | — | — | — |
| 2 | 50 | 25 | — | — | — | — | — | — | — | — | — | 25 |
| 3 | — | 33.33 | 33.33 | — | — | — | — | — | — | — | — | 33.33 |
| 4 | 49.67 | 24.66 | 24.67 | — | — | — | — | — | 1 | — | — | — |
| 4a | 48.34 | 23.33 | 23.33 | — | — | — | — | — | 5 | — | — | — |
| 5 | 49.67 | 24.67 | 24.66 | — | — | — | — | — | — | 1 | — | — |
| 5a | 48.34 | 23.33 | 23.33 | — | — | — | — | — | — | 5 | — | — |
| 6 | 49.67 | 24.67 | 24.66 | — | — | — | — | — | — | — | 1 | — |
| 6a | 48.34 | 23.33 | 23.33 | — | — | — | — | — | — | — | 5 | — |
| 7 | — | 33.33 | 33.33 | 33.34 | — | — | — | — | — | — | — | — |
| 8 | 49.67 | 24.67 | 24.66 | — | — | 1 | — | — | — | — | — | — |
| 8a | 48.34 | 23.33 | 23.33 | — | — | 5 | — | — | — | — | — | — |
| 9 | 49.67 | 24.67 | 24.66 | — | — | — | 1 | — | — | — | — | — |
| 9a | 48.34 | 23.33 | 23.33 | — | — | — | 5 | — | — | — | — | — |
| 10 | 50 | — | 25 | — | — | — | — | 25 | — | — | — | — |
| 11 | 49.67 | 24.67 | 24.66 | — | 1 | — | — | — | — | — | — | — |
| 11a | 48.34 | 23.33 | 23.33 | — | 5 | — | — | — | — | — | — | — |

[a] N-methylimidazole;
[b] 1-aminopropane-2-ol;
[c] dimethyl sulfoxide;
[d] NN-dimethyl-lactamide;
[e] ethyleneoxide adduct of 1,4-bytenediol, molar ratio 2:1;
[f] 2-hydroxyethyl-(2'-hydroxypropyl) sulfoxide;
[g] propyleneoxide-ethyleneoxide (molar ratio 7:10) adduct of tristyrylphenol;
[h] propyleneoxide-ethyleneoxide (molar ratio 7:15) adduct of tristyrylphenol;
[i] 2-hydroxyethyl-(1',2'-dihydroxypropyl) sulfoxide;
[j] propyleneoxide-ethyleneoxide adduct of diethyleneglycol, molar ratio 6:6:1;
[k] metosulfate of diethylenetriamine quaternized with dimethylsulfate, molar ratio 1:8;
[l] ethyleneoxide-styrene oxide (molar ratio 15:7) adduct of 2-propylheptanol;

TABLE 2

Composition of the Photoresist Stripping and Cleaning Compositions 1-11 of the Examples 12-18

| Examples No. | Solvents A/% by weight | | | Additives B and C/% by weight | | | | | | | | |
|---|---|---|---|---|---|---|---|---|---|---|---|---|
| | NMI[a] | MIPA[b] | DMSO[c] | b1[d] | b5-1[e] | b6-2[m] | b3[n] | b4[f] | b10-1[g] | b10-2[h] | b9[l] | c[o] |
| 12 | 49.1 | 24.55 | 24.55 | — | 0.9 | 0.9 | — | — | — | — | — | — |
| 13 | — | 33 | 33 | 33 | — | — | 1 | — | — | — | — | — |
| 14 | — | 31.6 | 31.6 | — | — | — | — | — | 31.8 | — | — | 5 |
| 15 | — | 31.6 | 31.6 | — | — | — | — | — | — | 31.8 | — | 5 |
| 16 | — | 30 | 30 | — | — | — | — | — | 30 | — | — | 10 |
| 17 | — | 30 | 30 | — | — | — | — | — | — | 30 | — | 10 |
| 18 | 49 | 24.5 | 24.5 | — | — | — | 1 | 1 | — | — | — | — |

[a] N-methylimidazole;
[b] 1-aminopropane-2-ol;
[c] dimethyl sulfoxide;
[d] NN-dimethyl-lactamide;
[e] ethyleneoxide adduct of 1,4-bytenediol, molar ratio 2:1;
[f] 2-hydroxyethyl-(2'-hydroxypropyl) sulfoxide;
[g] propyleneoxide-ethyleneoxide (molar ratio 7:10) adduct of tristyrylphenol;
[h] propyleneoxide-ethyleneoxide (molar ratio 7:15) adduct of tristyrylphenol;
[l] ethyleneoxide-styrene oxide (molar ratio 15:7) adduct of 2-propylheptanol;
[m] tris(2-hydroxyethyl) methyl ammonium metosulfate;
[n] N,N-di(2-hydroxyethyl) acetamide;
[o] nonylbenzenesulfonic acid and triethanolamine (molar ratio 1:1), 55% by weight in water The compatibility of the photoresist stripping and cleaning compositions 1-18 with sensitive materials such as titanium nitride, hafnium-silicon-oxide-nitride, hafnium oxide, NMOS-Si, PMOS-Si and Silicium-Germanium was tested by etching experiments conducted at 50° C. for 60 minutes each. All the photoresist stripping and cleaning compositions 1-18 showed low etching rates, i.e. etching rates 0-<100 μm/min as determined by material thickness measurements using an ellipsometer, and were therefore highly suitable for the FEOL process.

On the other hand, they exhibited excellent stripping and cleaning power versus ion implanted photoresists as determined in beaker tests with 2×2 cm$^2$ silicon wafer coupons carrying either polysilicon structures having a width of several 100 μm or polysilicon structures having a width of 70 nm and being spaced apart 500 nm. These structures were crossed at an angle of 90° by PMOS implanted (both tilted and non-tilted) deep UV (248 nm) photoresists lines having a width of 300 nm and being spaced apart 300 nm.

The implantation was carried out with arsenic (As) with a dose of $3.2\times10^{13}$ atoms/cm$^2$ with an energy of 40 keV and at a tilt angle of 15°. Additionally, the crust was implanted by fluorine (F) with a dose of $2.0\times10^{15}$ atoms/cm$^2$ with an energy of 10 keV at a tilt angle of 0°, and boron (B) with a dose of $7.0\times10^{14}$ atoms/cm$^2$ with an energy of 0.7 keV at a tilt angle of 0°.

The silicon wafer coupons were positioned horizontally in beakers each containing 100 ml of one of the photoresist stripping and cleaning compositions 1-18. The beakers were placed in ultra-sonic baths to mimic the physical force of a single wafer tool (e.g., spray or megasonics) for 2 minutes at a solution temperature of 50° C. After the stripping, the wafer coupons were rinsed with isopropanol and deionized water, before they were dried under nitrogen. The cleaning quality was first checked optically. The wafer coupons proved to be optically clean were inspected by scanning electron microscopy (SEM). No or only minor amounts of crusts and residues were left on the polysilicon structures.

The stripping and cleaning power could be enhanced even further by way of pre-ashing the ion implanted test wafer coupons by a short and mild oxygen plasma treatment before the stripping and cleaning process. Thereafter, no more crusts and residues could be found.

We claim:

1. A composition comprising a component (A) which comprises the polar organic solvents N-methylimidazole, dimethylsulfoxide and 1-aminopropane-2-ol, wherein said composition is free from N-alkylpyrrolidones and added quaternary ammonium hydroxides.

2. The composition according to claim 1, wherein component (A) comprises, based on the complete weight of all the three polar organic solvents,
   from 10-80% by weight N-methylimidazole,
   from 10-45% by weight dimethyl sulfoxide and
   from 10-45% by weight 1-aminopropane-2-ol.

3. The composition according to claim 2, wherein component (A) comprises N-methylimidazole, dimethyl sulfoxide and 1-aminopropane-2-ol in a weight ratio of from 0.5:(0.6-1.4):1 to 4:(0.6-1.4):1.

4. The composition according to claim 1, further comprising at least one additive (B) selected from the group consisting of:
   (B-I) quaternary ammonium salts,
   (B-II) sulfoxides and thioethers,
   (B-III) surfactants and
   (B-IV) other additives, wherein the other additives are selected from the group consisting of:
   (b1) 2-hydroxypropionic acid amides of formula I:

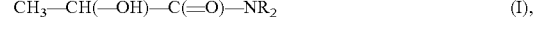
   $$CH_3—CH(—OH)—C(=O)—NR_2 \quad (I),$$

wherein R represents alkyl groups having 1-6 carbon atoms,
   (b2) aliphatic esters of the formula II:

   $$R^1—C(=O)—O—R^2 \quad (II),$$

wherein R$^1$ represents alkyl groups having from 1-4 carbon atoms and R$^2$ represents linear and branched alkyl groups having from 4-8 carbon atoms;
   (b3) acetic, propionic, butyric, pentanoic acid and hexanoic acid amides of formula III:

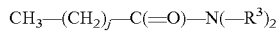  (III), wherein j represents 0 or an integer from 1 to 4 and $R^3$ represents an alkyl group having from 2-6 carbon atoms and optionally having at least one hydroxyl group, and (b7) ethyleneoxide adducts of diols of formula V:

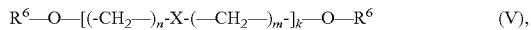  (V), wherein n and m represent independently of each other an integer from 2-4, k represents an integer from 1-3, X represents an oxygen or a sulfur atom, and $R^6$ represents a residue of formula VI:

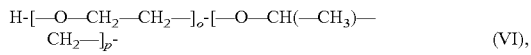  (VI), wherein o is an integer from 2-12 and p is 0 or an integer from 1-6.

5. The composition according to claim 4, wherein additive (B-II) is selected from the group consisting of:
(b4) sulfoxides and thioethers of formula IV:

  (IV), wherein x is 0 or 1 and $R^4$ and $R^5$ can be the same or different from each other and comprise at least two carbon atoms.

6. The composition according to claim 4, wherein additive (B-III) is selected from the group consisting of:
(b5) alkyleneoxide adducts of acetylenic alcohols;
(b8) adducts of alkylphenols wherein the alkyl residue has from 6-16 carbon atoms with at least one alkyleneoxide selected from the group consisting of ethyleneoxide, propyleneoxide, butyleneoxide and styrene oxide;
(b9) adducts of alcohols selected from the group consisting of saturated and unsaturated, linear and branched, aliphatic alcohols having from 6-20 carbon atoms, with alkyleneoxides with at least one alkyleneoxide selected from the group consisting of ethyleneoxide, propyleneoxide, butyleneoxide and styrene oxide, and
(b10) tristyrylphenol ethers selected from the group consisting of
(b-10-1) tristyrylphenol-poly(alkyleneglycol) ethers of at least one glycol selected from the group consisting of ethane-1,2-diol, 1-phenylethane-1,2-diol, propane-1,2- and -1,3-diol, butane-1,2-, -1,3- and -1,4-diol and 2-methylpropane-1,2- and -1,3-diol; and
(b-10-2) adducts of tristyrylphenol and at least one alkyleneoxide selected from the group consisting of ethyleneoxide, propyleneoxide, butyleneoxide and styrene oxide.

7. The composition according to claim 4, wherein additive (B-I) is selected from the group consisting of:
(b6) quaternary ammonium salts of at least one acid selected from the group consisting of hydrochloric acid, hydrobromic acid, acidic phosphonic acid esters, acidic phosphoric acid esters and acidic sulfuric acid esters, and wherein the quaternary ammonium salts comprise at least one quaternary nitrogen atom.

8. The composition according to claim 1, further comprising additive (C) which is selected from the group consisting of surfactants and alkanolamines other than 1-aminopropane-2-ol and optionally an oxidizing agent (D).

9. A method for preparing the composition according to claim 1 comprising
(1) mixing the three organic polar solvents (A) in the absence of N-methylpyrrolidone and quaternary ammonium hydroxides; and
(2) homogenizing the resulting mixture thereby producing the composition.

10. A method for removing bulk photoresists, patterned photoresists, contaminants and crusts and/or residues resulting from etching, ashing and/or ion implantation processes from a substrate, said method comprising
(i) contacting the substrate at least once with the composition according to claim 1; and
(ii) removing the substrate from the contact with the photoresist stripping and cleaning composition.

11. A method for manufacturing an electrical device comprising
(a) forming a photoresist pattern on a substrate covering the features and the areas of the substrate which are not to be exposed to an ion implantation treatment;
(b) exposing the substrate with the photoresist pattern to an ion implantation treatment thereby forming doped regions in the areas not covered by the photoresist pattern; and
(c) removing the photoresists and the crusts and/or residues formed by the ion implantation treatment by the method according to claim 10 thereby obtaining the electrical device.

12. The method of claim 11, wherein the substrate is a virgin semiconductor wafer or a semiconductor wafer having features with nm and/or μm dimensions.

13. The method of claim 12, wherein the features are transistor structures comprising a gate, a source, a drain, a gate oxide layer comprising high-k materials and a channel layer comprising silicon-germanium or germanium.

14. A method for preparing a photoresist stripping and cleaning composition, said method comprising
(1) mixing at least two organic polar solvents (A) and optionally one or more additives selected from (B), (C) and (D), and
(2) homogenizing the resulting mixture thereby producing the photoresist stripping and cleaning composition,
wherein said composition is substantially free of N-methylpyrrolidone and quaternary ammonium hydroxides, and
organic polar solvents (A) are selected from the group consisting of N-methylimidazole, dimethylsulfoxide and 1-aminopropane-2-ol,
additive (B) is selected from the group consisting of:
(B-I) quaternary ammonium salts,
(B-II) sulfoxides and thioethers,
(B-III) surfactants, and
(B-IV) other additives, wherein these other additives are selected from the group consisting of:
(b1) 2-hydroxypropionic acid amides of formula I:

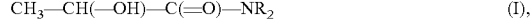  (I), where R represents alkyl groups having from 1 to 6 carbon atoms,
(b2) aliphatic esters of the formula II:

  (II), where, independently of each other, R' represents alkyl groups having from 1 to 4 carbon atoms and $R^2$ represents linear and branched alkyl groups having from 4 to 8 carbon atoms,
(b3) acetic, propionic, butyric, pentanoic acid and hexanoic acid amides of formula III:

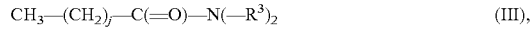  (III), where j represents 0 or an integer from 1 to 4 and $R^3$ represents an alkyl group having from 2 to 6 carbon atoms and optionally at least one hydroxyl group, and
(b7) ethyleneoxide adducts of diols of formula V:

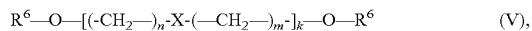

$$R^6-O-[(-CH_2-)_n-X-(-CH_2-)_m-]_k-O-R^6 \quad (V),$$

where n and m represent, independently of each other, an integer from 2 to 4, k represents an integer from 1 to 3, X represents an oxygen or a sulfur atom, and $R^6$ represents a residue of formula VI:

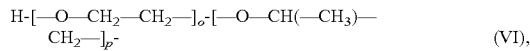

$$H-[-O-CH_2-CH_2-]_o-[-O-CH(-CH_3)-CH_2-]_p- \quad (VI),$$

where o is an integer from 2 to 12 and p is 0 or an integer from 1 to 6, additive (C) is selected from the group consisting of surfactants other than additive (B-III) and alkanolamines other than 1-aminopropane-2-ol, and additive (D) is an oxidizing agent selected from the group consisting of organic peroxides, inorganic peroxides, and ozone.

15. A composition for photoresist stripping and cleaning, said composition is prepared by the method of claim 14.

16. A method for removing bulk photoresists, patterned photoresists, contaminants and crusts and/or residues resulting from etching, ashing and/or ion implantation processes from a substrate, said method comprising contacting the substrate at least once with the composition according to claim 15, removing the substrate from the contact with the photoresist stripping and cleaning composition, rinsing the substrate with a rinsing solution, said solution comprising deionized water, alkanolamines, or a mixture thereof, and drying the substrate.

17. A method for manufacturing an electrical device comprising forming a photoresist pattern on a substrate covering the features and the areas of the substrate which are not to be exposed to an ion implantation treatment, exposing the substrate with the photoresist pattern to an ion implantation treatment thereby forming doped regions in the areas not covered by the photoresist pattern, and removing the photoresists and the crusts and/or residues formed by the ion implantation treatment by the method of claim 16 thereby obtaining the electrical device.

\* \* \* \* \*